United States Patent [19]

Soelkner Gerald

[11] Patent Number: 4,908,568
[45] Date of Patent: Mar. 13, 1990

[54] MECHANICAL PROBE FOR OPTICAL MEASUREMENT OF ELECTRICAL POTENTIALS

[75] Inventor: Soelkner Gerald, Linz, Fed. Rep. of Germany

[73] Assignee: Siemens Aktiengesellschaft, Berlin and Munich, Fed. Rep. of Germany

[21] Appl. No.: 187,332

[22] Filed: Apr. 28, 1988

[30] Foreign Application Priority Data

Jun. 9, 1987 [DE] Fed. Rep. of Germany ....... 3719204

[51] Int. Cl.$^4$ ..................... G01R 19/00; G01R 31/00; G02F 1/09
[52] U.S. Cl. .................................. 324/96; 324/158 R; 350/356; 350/376
[58] Field of Search ................. 324/96, 158 R, 117 R; 350/356, 374, 376; 356/368

[56] References Cited

U.S. PATENT DOCUMENTS 4,269,483 5/1981 Feldtkeller ............................ 324/96
4,465,969 8/1984 Tada et al. ............................ 324/96
4,631,402 12/1986 Nagatsuma et al. .................. 324/96

OTHER PUBLICATIONS

"Noncontact Electro-Optic Sampling with a Gallium Arsenide Injection Laser" by Nees, et al., Electronic Letters, vol. 22, No. 17, Aug. 14, 1986, pp. 918–919.
"Subpicosecond Electrical Sampling and Applications" by Valdmanis et al. in Picosecond Optoelectronic Devices, Academic Press, Inc., 1984, pp. 249 through 270.
Valdmanis et al.; "Electro-Optic . . . "; Laser Focus-/Electro-Optics; Feb. 1986; pp. 84, 85, 86, 88, 90, 92, 94, 96.

Primary Examiner—Ernest F. Karlsen
Attorney, Agent, or Firm—Hill, Van Santen, Steadman & Simpson

[57] ABSTRACT

A mechanical probe for optical measurement of electrical potentials. The probe of the present invention is composed of a cubic, electro-optical crystal fashioned in the form of a tip and of a metallization which is at ground potential and which covers the crystal with the exception of those surface regions located immediately opposite a measuring location, for example an interconnect of an integrated circuit. Since the metallization acting as a cooperating electrode significantly facilitates the penetration of the electrical stray field into the crystal tip, geometry-dependent effects and influences of electrical microfields are nearly completely supressed. The probe therefore makes it possible to utilize the voltage difference instead of the topography-dependent field difference for optical measurement of electrical signals with high chronological resolution.

8 Claims, 1 Drawing Sheet

MECHANICAL PROBE FOR OPTICAL MEASUREMENT OF ELECTRICAL POTENTIALS

BACKGROUND OF THE INVENTION

The present invention is directed to a mechanical probe for optical measurement of electrical potentials.

A probe composed of an electro-optical crystal is disclosed in a publication by J. A. Valdmanis, "Sub-picosecond Electrical Sampling and Applications", that appeared in Picosecond Optoelectronic Devices, Academic Press, Inc., 1984, pages 249–270, particularly pages 257–258 including FIG. 7. However, only measurements on specific structures can be carried out with this probe.

A probe used for electro-optical sampling methods is disclosed in Electronics Letters, Aug. 14, 1986, Vol. 22, No. 17, pages 918–919.

SUMMARY OF THE INVENTION

It is an object of the present invention to provide a mechanical probe of the species initially cited with which electrical potentials or signals at arbitrary points on an electronic circuit, particularly of a micro-electronic circuit, can be optically measured with high chronological resolution.

The mechanical probe has an electro-optical crystal which receives electro-magnetic radiation. The probe has a cubic crystal fashioned in the form of a tip having an electrode located on the surface thereof in the region of the tip. The advantage obtainable with the present invention is that signals in integrated circuits can be optically measured in non-contacting fashion with high chronological resolution.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1A:
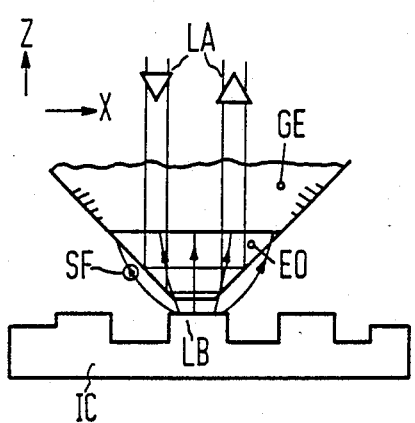
FIG. 1a is a cross-sectional diagram depicting the mechanical probe of the present invention.
Figure 1B:
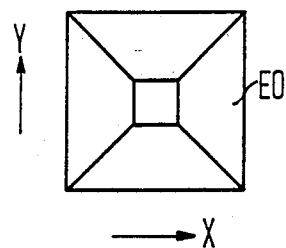
FIG. 1b is a plan view of the FIG. 1a probe.

The mechanical probe schematically shown in FIGS. 1a and 1b are essentially composed of a cubic, electro-optical crystal EO, for example ZnTe, ZnSe or GaAs, fashioned in the form of a tip, and of a metallization GE which is at ground potential that covers the crystal EO except for the surface regions immediately opposite a measuring location, for example an interconnect LB of a component of a micro-electronic integrated circuit IC. Since the metallization GE acting as a cooperating electrode significantly facilitates the penetration of the electrical stray field SF into the electro-optical crystal EO, geometry-dependent defects and influences of electrical micro-fields are nearly completely supressed. It is therefore possible with the mechanical probe of the present invention to utilize the voltage difference instead of the topography-dependent field difference for optical measurement of electrical signals with high chronological resolution. As a result of the good cleavability of cubic crystals, extremely fine tips (see FIG. 1b) having diameters of a few micrometers can be produced, so that even modern (large scale integrated) LSI circuits can be tested with such a probe. The time-dependency of the signal fed into the interconnect LB can be measured in a known way (see, for example, the publications intially cited) upon utilization of the electro-optical effect, and can be measured with the use of a laser beam LA that detects the electrical stray field SF in the crystal tip. A sampling method is typically used wherein a polarized laser beam LA generated in a scanning laser microscope is synchronized with the signal at the measuring location and the phase relation of the laser pulses with respect to the signal is continuously varied, for example by lengthening or shortening the beam path between the laser source and the crystal. Since the (1, 1, 1) - direction of the cubic crystal EO, that is the body diagonal of the cube, is oriented perpendicular to the component surface and, thus parallel to the optical axis of the scanning laser microscope, the laser beam that samples the electrical stray field SF can be deflected in the direction of the measuring system that detects the polarization condition. The laser beam is deflected by total reflection at the lateral faces of the crystal without any mirror systems.

Conventional probe holders known in the art of electrical metrology (probe measuring location) can be employed for positioning the roughly 0.5 through 1 mm long electro-optical crystal EO onto the interconnect LB. These probe holders are attached with magnetic or vacuum adaptors to, for example, a frame that is precisely, linearly height-adjustable with four synchronously running guide spindles. Such a probe holder is usually composed of a mount for the acceptance of the probe, of a probe arm and of a precise mechanism that allows a linear displacement of the probe in three directions that are orthogonal to one another. Instead of these probe holders, electrostrictive manipulators having a positioning precision of about 0.1 $\mu$m which is adequate for modern LSI circuits can also be used. The height positioning of the crystal tip above the interconnect LB can be designed in an especially simple fashion when interference effects with the component surface or variations of the total reflection are utilized and when the crystal tip is moved away from the subject surface ("Attenuated Total Reflection -ATR").

Figure 2A:
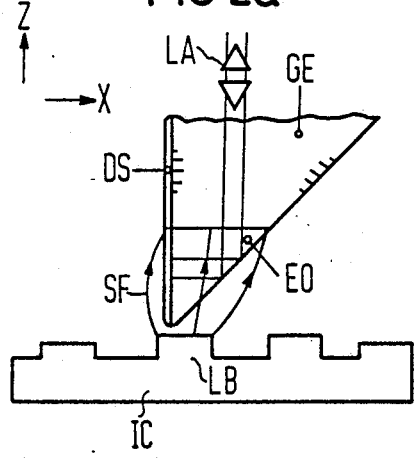
FIG. 2a is a cross-sectional diagram depicting an alternative the present invention.
Figure 2B:
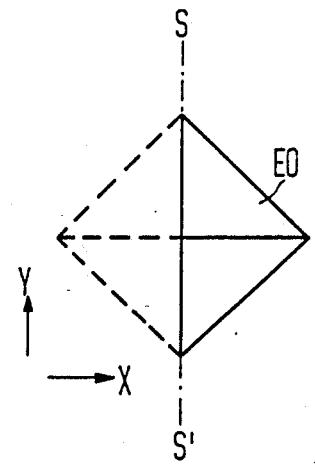
FIG. 2b a plan view of the FIG. 2a probe.

As a consequence of the size of the electro-optical crystal EO (maximum thickness in the region of the mount is about 0.5 mm), the positioning of the probe onto the component surface can only be monitored with the assistance of a second optical system. A probe that avoids this disadvantage is schematically shown in FIGS. 2a and 2b. The probe is likewise composed of a cubic, electro-optical crystal EO and of a metallization GE which is at ground potential and which covers the crystal EO with the exception of those surface regions located immediately opposite the interconnect LB. By cleaving along the line S-S' (see FIG. 2b), the crystal EO is thereby fashioned such that it has an end face oriented perpendicular relative to the component surface. The lateral face lying opposite the end face provided with a reflective layer DS (dielectric mirror) thereby forms an angle of 45° with the direction of the laser beam and, thus, with the (1, 1, 1) - direction of the cubic crystal EO. In comparison to the probe illustrated in FIGS. 1a and 1b, this embodiment offers the advantage that the voltage measurement and the tip positioning can be carried out with the same optical system (scanning laser microscope).

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A mechanical probe for optical measurement of electrical potentials and having an electro-optical crystal which is located immediately above a subject surface and which is penetrated by a light ray, comprising a cubic crystal fashioned in the form of a tip having an electrode located on a surface thereof in the region of the tip.

2. The mechanical probe according to claim 1, wherein a (1, 1, 1) - direction of the crystal is oriented perpendicular to the subject surface.

3. The mechanical probe according to claim 1, wherein the crystal has a first lateral face oriented perpendicular relative to the subject surface and provided with a reflective layer.

4. The mechanical probe according to claim 3, wherein a second lateral face of the crystal forms an angle of 45° with said first lateral face.

5. The mechanical probe according to claim 1, wherein a metallization is provided as the electrode.

6. A mechanical probe for optical measurement of electrical potentials and having an electro-optical crystal which is located immediately above a specimen subject and which is penetrated by a light ray, comprising:
   a cubic crystal fashioned in the form of a tip, a (1, 1, 1) - direction of the crystal being oriented perpendicular to the subject surface; and
   a metallization forming an electrode on a surface of the crystal in the region of the tip.

7. The mechanical probe according to claim 6, wherein the crystal has a first lateral face oriented perpendicular relative to the subject surface and provided with a reflective layer.

8. The mechanical probe according to claim 7, wherein a second lateral face of the crystal defines an angle of 45° with said first lateral face.

* * * * *